United States Patent [19]
Hodges

[11] Patent Number: 5,432,129
[45] Date of Patent: Jul. 11, 1995

[54] METHOD OF FORMING LOW RESISTANCE CONTACTS AT THE JUNCTION BETWEEN REGIONS HAVING DIFFERENT CONDUCTIVITY TYPES

[75] Inventor: Robert L. Hodges, Euless, Tex.

[73] Assignee: SGS-Thomson Microelectronics, Inc., Carrollton, Tex.

[21] Appl. No.: 55,077

[22] Filed: Apr. 29, 1993

[51] Int. Cl.⁶ .......................................... H01L 21/28
[52] U.S. Cl. ..................................... 437/200; 437/47; 437/52; 437/193; 437/956; 148/DIG. 19
[58] Field of Search .................. 437/52, 200, 193, 47, 437/956; 148/DIG. 147, 19

[56] References Cited

U.S. PATENT DOCUMENTS

| | | | |
|---|---|---|---|
| 4,333,099 | 6/1982 | Tanquay et al. | 148/DIG. 147 |
| 4,463,491 | 8/1984 | Goldman et al. | 437/200 |
| 5,059,554 | 10/1991 | Spinner et al. | 437/193 |
| 5,151,387 | 9/1992 | Brady et al. | 437/191 |
| 5,187,114 | 2/1993 | Chan et al. | 437/52 |
| 5,223,447 | 6/1993 | Lee et al. | 437/47 |

FOREIGN PATENT DOCUMENTS 0503904 9/1992 European Pat. Off. .

OTHER PUBLICATIONS

Wolf et al., Silicon Processing, Lattic Press 1986, pp. 176–195.

Primary Examiner—T. N. Quach
Attorney, Agent, or Firm—Renee M. Larson; Lisa K. Jorgenson; Richard K. Robinson

[57] ABSTRACT

A thin film transistor structure having a first and a second polycrystalline silicon layer of different conductivity types (P and N) has a high resistance contact at the resultant P-N junction. This contact resistance is reduced by forming $TiSi_2$ (titanium disilicide) or other refractory metal silicides such as cobalt or molybdenum in specific regions, namely the P-N junction contact. Titanium disilicide consumes the portion of the second polycrystalline silicon layer in the P-N contact junction and at the same time consumes a small portion of the underlying first polycrystalline silicon layer, such that the high resistance P-N junction now no longer exists.

23 Claims, 3 Drawing Sheets

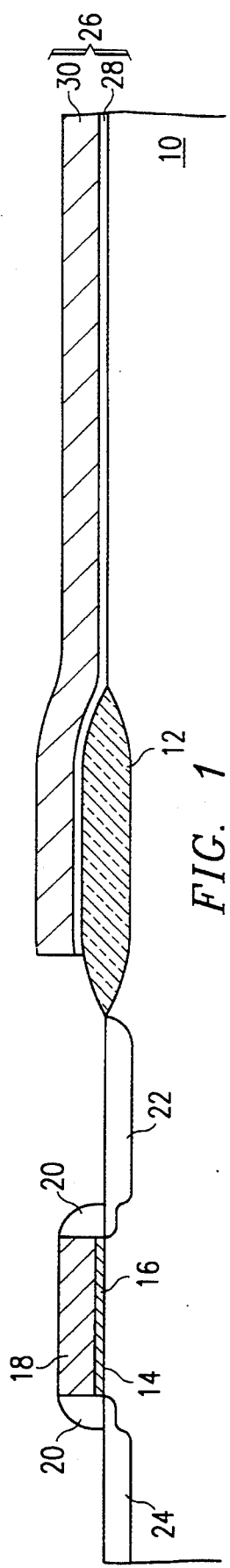
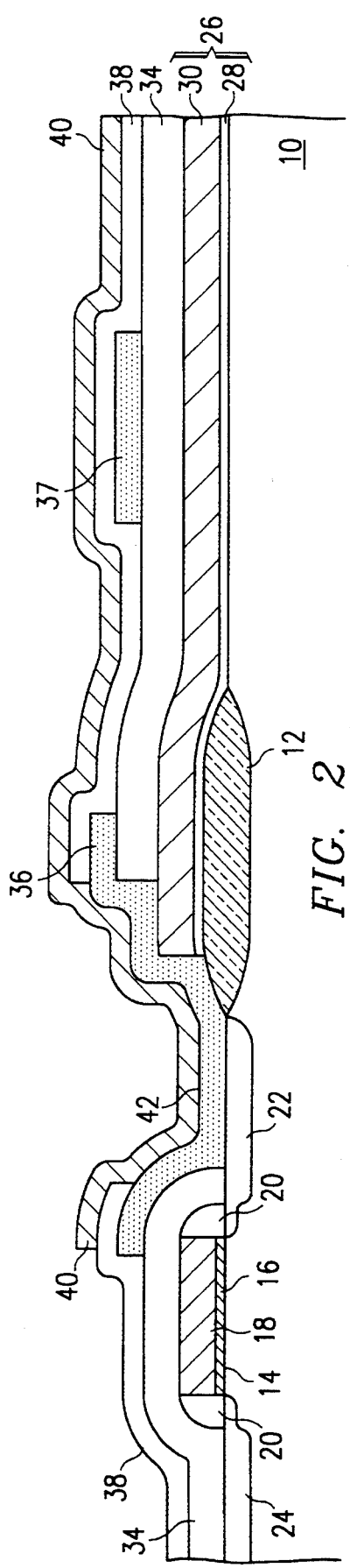
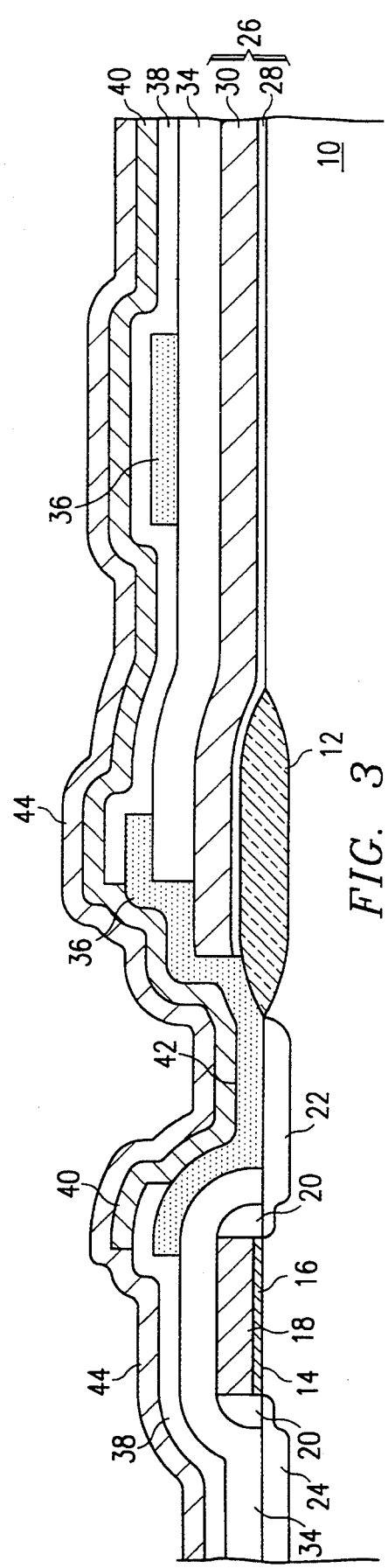

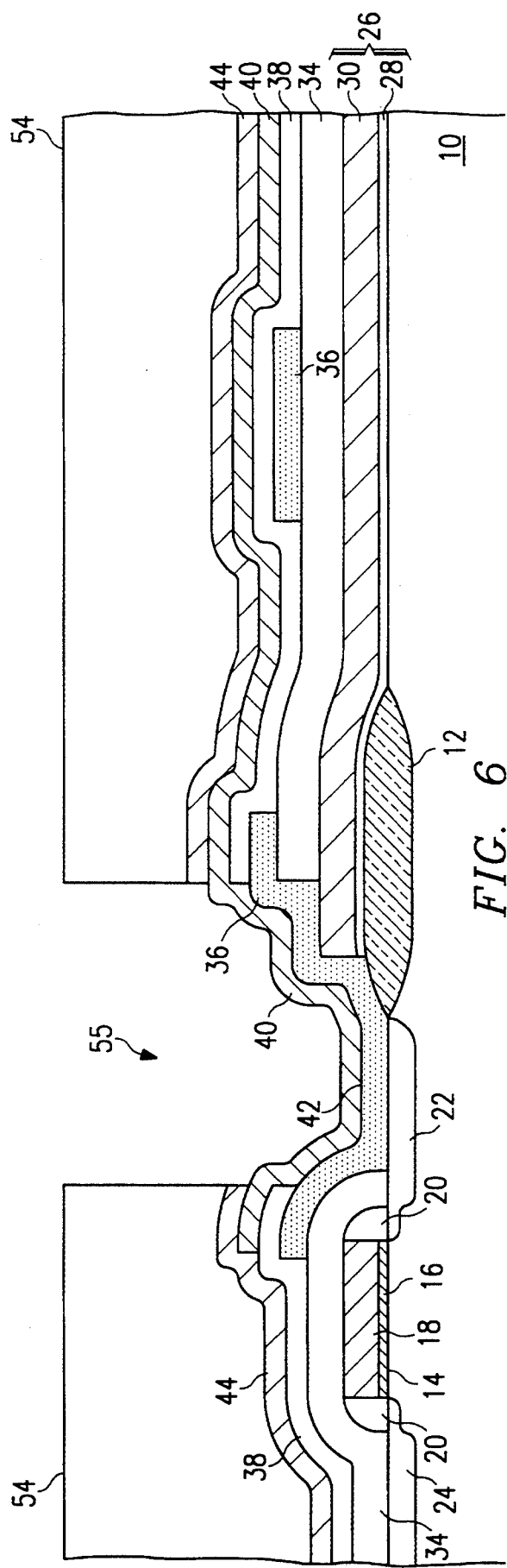
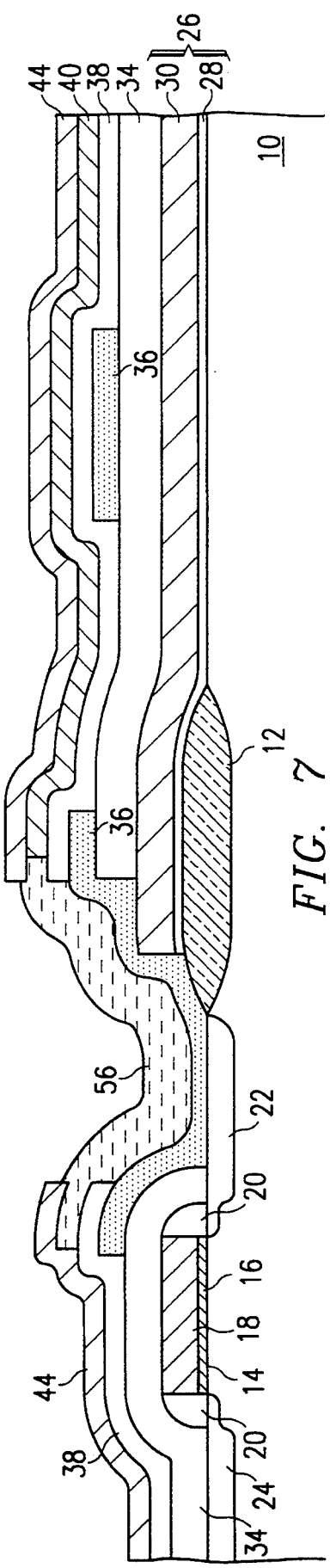

1

METHOD OF FORMING LOW RESISTANCE CONTACTS AT THE JUNCTION BETWEEN REGIONS HAVING DIFFERENT CONDUCTIVITY TYPES

BACKGROUND OF THE INVENTION

1. Field of the Invention:

The present invention relates generally to semiconductor integrated circuit processing, and more specifically to a transistor structure having low contact resistance at the P-N junction or diode where contact or interconnect between at least two regions having different conductivity type occurs, such as in thin film technology.

2. Description of the Prior Art:

PN diode interconnection technology, such as thin-film transistor (TFT) or polycrystalline silicon technology, is used in SRAM and video display technology because of the high density advantage it provides. In thin-film transistor technology, P-channel polycrystalline silicon transistors are generally used as the PMOS load with the NMOS drivers and passgates built in the single crystal substrate. The use of P-channel transistors as the load for the SRAM cell usually results in better electrical characteristics than n-channel transistors, and they are typically faster than resistive loads. Additionally, P-channel transistors provide greater immunity to noise.

In spite of the benefits associated with the use of polycrystalline silicon P-channel transistors as load transistors, a disadvantage arises when interconnection between polycrystalline silicon lines having different conductivity types occurs, causing high resistance contacts to be formed. TFT technology of three polycrystalline silicon layers of different conductivity types will result in polycrystalline silicon interconnect lines of different conductivity making contact. For instance, interconnection between a P+polycrystalline silicon layer and an adjacent N+ polycrystalline silicon layer results in a high resistance contact being formed at the resultant P-N junction. In a three layer polycrystalline silicon transistor, with the second and third layers composed of N+ and P+ materials, respectively, a high resistance contact is formed at the P-N junction between the second and third polycrystalline silicon layers.

SUMMARY OF THE INVENTION

It is therefore an object of the present invention to reduce the contact resistance at the P-N junction of a transistor structure.

A thin film transistor structure having a first and a second polycrystalline silicon layer of different conductivity types (P and N) has a high resistance contact at the resultant P-N junction. This contact resistance is reduced by forming $TiSi_2$ (titanium disilicide) or other refractory metal silicides such as cobalt or molybdenum in specific regions, namely the P-N junction contact. Titanium disilicide consumes the portion of the second polycrystalline silicon layer in the P-N contact junction and at the same time consumes a small portion of the underlying first polycrystalline silicon layer, such that the high resistance P-N junction now no longer exists.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 1–7 illustrate a preferred method for forming a P-N junction with reduced resistance according to the present invention.

DESCRIPTION OF THE PREFERRED EMBODIMENT

Figure 4:
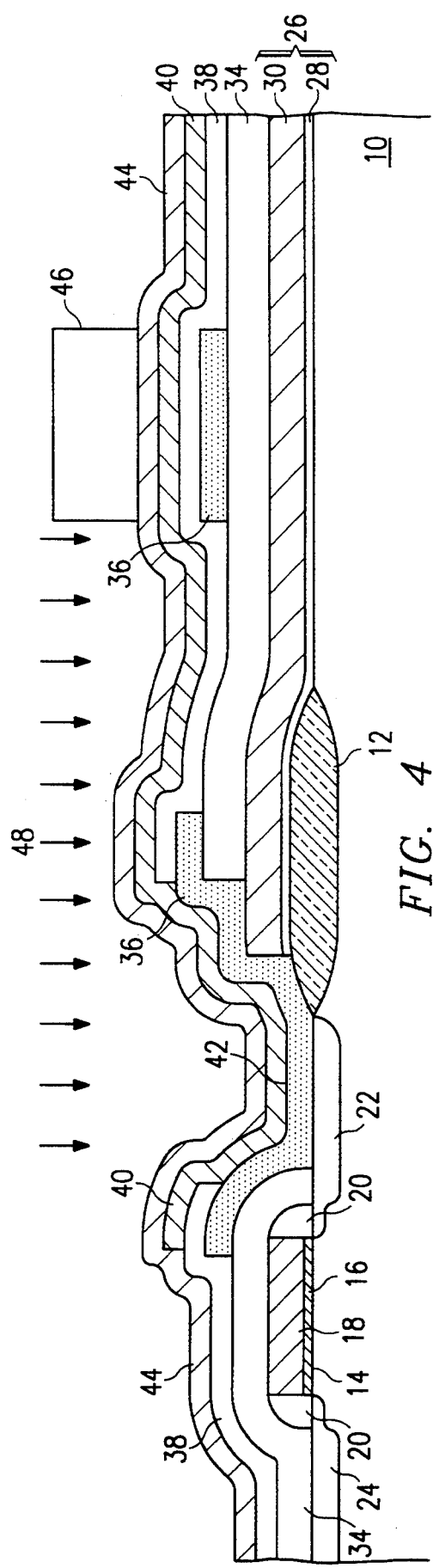

The process steps and structures described below do not form a complete process flow for manufacturing integrated circuits. Rather, the present invention may be practiced in conjunction with integrated circuit fabrication techniques currently known in the art, and only so much of the commonly practiced process steps are included as are necessary to provide an understanding of the present invention. The figures representing cross-sections of portions of an integrated circuit during fabrication are not drawn to scale, but instead are drawn so as to illustrate the important features of the present invention.

Referring to FIG. 1, an integrated circuit device is to be formed in a silicon substrate 10. Selected regions of the substrate 10 are oxidized to form a field oxide insulating region 12. A first N-channel field effect device 14 having a gate oxide layer 16, a first gate electrode 18, sidewall oxide spacers 20 and source/drain regions 22, 24 are manufactured by methods well known in the art. A second N-channel field effect device 6 is formed by methods known in the art having a gate oxide layer 28 and a second gate electrode 30. As with the first N-channel field effect device 14, the second N-channel field effect device 26 is generally formed from a first polycrystalline silicon layer. The source/drain region 22 of device 14 and the gate electrode 30 form the interconnected conductive structures of the N-channel devices.

Referring to FIG. 2, a first oxide insulating layer 34 is formed over the integrated circuit by known methods. Insulating layer 34 is patterned and etched to expose a portion of the underlying conductive structure source/drain region 22 of device 14. A portion of the second gate electrode 30 of the second N-channel device 26 may also be exposed during the patterning and etching steps. Source/drain region 22 of the first N-channel field effect device is typically implanted with an N+ type dopant such as arsenic or phosphorus. Gate electrode 30 is usually in-situ doped or phosphorous doped using $POCl_3$ during a phosphorous deposition.

Second gate electrode and polycrystalline silicon layer 30 is patterned and etched prior to chemical vapor deposition (CVD) of oxide 34 onto polycrystalline silicon layer 30 in the range of 300 to 2000 Angstroms. Polycrystalline silicon layer 36 is then deposited on the device and etched to define interconnect regions, followed by a thin film transistor gate implant of phosphorous at approximately $1 \times 10_{18}/cm^3$ which makes polycrystalline silicon layer 36 N+ conductivity material; phosphorous or other N+-type material could also be deposited instead of implanted. Polycrystalline silicon layer 37 will form the gate of a transistor which is not shown here. Besides phosphorous, another N+ dopant material which could be used is arsenic. Next thin film transistor gate oxide deposition results in oxide insulating layer 38 which is followed by gate oxide densification. Densification of oxide insulating layer 38 could be performed in diluted $O_2$, $N_2$, or $H_2O$.

For the TFT technology shown in FIG. 2, the shared contact between polycrystalline silicon layers 36 and 40 is formed when oxide layer 38 is deposited on polycrystalline silicon layer 36 and then patterned and etched. Amorphous silicon, having P+ conductivity, is deposited followed by solid phase epitaxial growth (SPG) anneal to form polycrystalline silicon layer 40. Amorphous deposition of silicon, with large grains as close to a single crystal transistor as possible, is desired. Therefore, low temperature poly deposition of less than 600 degrees Celsius is used; laser recrystallization and anneal can also be used to enhance grain size. Additionally, hydrogen passivation can be performed to enhance device integrity. If desired, thin film transistor channel implantation may be performed.

Next, polycrystalline silicon layer 40 is patterned and etched by methods known in the art. Since polycrystalline silicon layers 36 and 40 have different conductivity types, the resultant P-N junction 42 between polycrystalline silicon layers 36 and 40 is a high resistance contact junction. The prior art structure of FIG. 2, has an undesirable high resistance contact at P-N junction 42. Applicant's invention proposes to reduce the contact resistance by forming $TiSi_2$ (titanium disilicide) or other refractory metal silicides such as cobalt or molybdenum in specific regions, namely the P-N junction contact.

Figure 5:
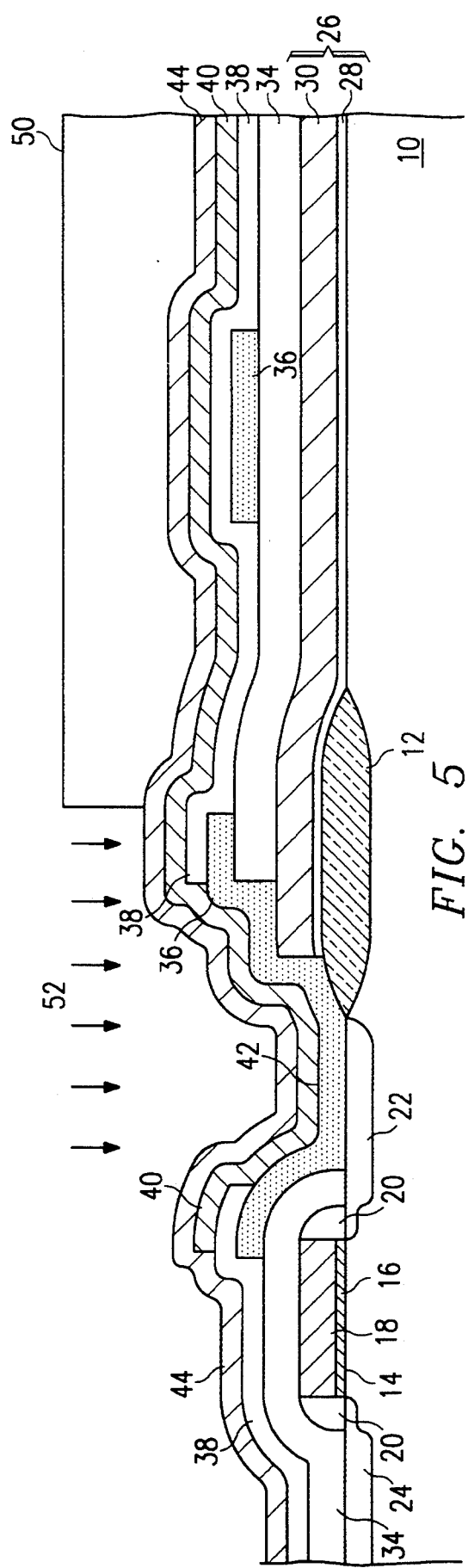

Referring now to FIG. 3, a silicon nitride insulating layer 44 is deposited over polycrystalline silicon layer 40. Silicon nitride layer 44 typically has a thickness on the order of approximately 50 to 500 angstroms. Besides silicon nitride, silicon dioxide may also be deposited over polycrystalline silicon layer 40. Next, as shown in FIG. 4, photoresist 46 is placed at an offset such that polycrystalline silicon layer 40 may be implanted 48 with dosages of P+ dopant materials such as Boron or $BF_2$. Next, the strategic placement of photoresist 50 defines the source and drain regions which may be implanted with heavier dosages 52, P++ for instance, of Boron or $BF_2$ as shown in FIG. 5. It should be noted that the offset implant 48 shown in FIG. 4, is an optional process step. If the offset implant 48 is not done, photoresist 46 instead of photoresist 50 should be used to perform the source/drain implant. Additionally, the offset implant and the source/drain implant may both be performed before the deposition of silicon nitride or silicon dioxide.

As shown in FIG. 6, photoresist 54 is positioned to create a salicide mask opening 55 such that the contact formed at P-N junction 42 between polycrystalline silicon layers 36 and 40 may be patterned and then subjected to a silicon nitride, or silicon dioxide, etch and resist strip. Next, as illustrated in FIG. 7, titanium is deposited over polycrystalline silicon layer 40 followed by rapid thermal annealing to form titanium disilicide in the P-N junction contact 42; besides titanium, other refractory metals such as cobalt or molybdenum may be used to form a metal silicide. Annealing of the titanium may also be performed in a furnace where a 600–800 degree Celsius anneal is performed. As titanium disilicide is being formed, a layer of titanium nitride is formed on top of the deposited layer of titanium. It is desirable to maximize the thickness of the titanium disilicide while minimizing the thickness of the titanium nitride. By varying the temperature and ambient gas during the anneal, it is possible to control the thickness of titanium nitride and titanium disilicide combinations.

Finally the titanium nitride layer is stripped away in a combination of sulfuric acid and hydrogen peroxide to leave titanium disilicide layer 56 in the P-N junction contact 42; additional, standard process steps well known in the art may now be applied. Titanium disilicide layer 56 consumes the portion of polycrystalline silicon layer 40 in the P-N contact junction 42 and at the same time consumes a small portion of the underlying polycrystalline silicon layer 36, such that P-N junction 42 now no longer exists. In this way, the contact between polycrystalline silicon layers 36 and 40 having different conductivity types is shorted out and therefore the contact resistance between them is drastically reduced.

P-N junctions typically have high resistance contacts which are a result of the connection of p-channel and n-channel devices whereby materials of different conductivity types are connected. Placing a metal or metal silicide interconnect layer as a shared contact between layers of different conductivity types prevents this high resistance P-N junction from forming.

While the invention has been particularly shown and described with reference to a preferred embodiment, it will be understood by those skilled in the art that various changes in form and detail may be made therein without departing from the spirit and scope of the invention.

What is claimed is:

1. A method of forming a portion of an integrated circuit, comprising:

forming a first polycrystalline silicon layer having a first conductivity type, wherein a first insulating layer is formed over a portion of the first polycrystalline silicon layer and is patterned and etched to expose a portion of the first polycrystalline silicon layer;

forming a second polycrystalline silicon layer having a second conductivity type and having a contact region with the first polycrystalline silicon layer, wherein the second polycrystalline silicon layer makes contact with the first polycrystalline silicon layer through the exposed portion of the first polycrystalline silicon layer;

forming a second insulating layer over the second polycrystalline silicon layer in the contact region so as to confine the converting step to the contact region; and converting the second polycrystalline silicon layer in the contact region, and a portion of the first polycrystalline silicon layer in the contact region, to a silicide; wherein the step of converting the second polycrystalline silicon layer to silicide comprises the further steps of:

forming a refractory metal layer over the second polycrystalline silicon layer; and annealing the refractory metal layer so as to form the metal silicide in the contact region.

2. A method of forming a portion of an integrated circuit, comprising:

forming a first polycrystalline silicon layer having a first conductivity type;

forming a first insulating layer over the first polycrystalline silicon layer;

patterning and etching the first insulating layer to expose a portion of the first polycrystalline silicon layer in a contact region;

forming a second polycrystalline silicon layer having a second conductivity type which makes electrical contact with the first polycrystalline silicon layer in the contact region;

patterning and etching the second polycrystalline silicon layer;

forming a second insulating layer over the second polycrystalline silicon layer;

etching an opening through the second insulating layer to create a salicide mask opening over the contact region;

forming a first metal containing layer over the second polycrystalline silicon layer; and annealing the first metal containing layer so as to form metal silicide which consumes the second polycrystalline silicon layer in the contact region and a portion of the first polycrystalline silicon layer in the contact region.

3. The method of claim 2, wherein the first conductivity type is P+ and the second conductivity type is N+.

4. The method of claim 2, wherein the first conductivity type is N+ and the second conductivity type is P+.

5. The method of claim 5, wherein before the step of forming the first polycrystalline silicon layer, the following, additional steps are performed:

forming a lower insulating layer over a substrate such that the first polycrystalline silicon layer is formed over the lower insulating layer; and patterning and etching the lower insulating layer to expose a portion of the source/drain region of a first field effect device.

6. The method of claim 5, wherein the lower insulating layer is patterned and etched to expose a portion of a second gate electrode of a second field effect device.

7. The method of claim 6, wherein the lower insulating layer has a thickness of between approximately 300 to 2000 Angstroms.

8. The method of claim 2, wherein after the step of forming a second insulating layer over the second polycrystalline silicon layer, an implant of the second polycrystalline silicon layer and an implant of a thin film transistor source/drain region of a first field effect device is performed.

9. The method of claim 2, wherein before the step of forming a second insulating layer over the second polycrystalline silicon layer, an implant of the second polycrystalline silicon layer and an implant of a thin film transistor source/drain region of a first field effect device is performed.

10. The method of claim 2, wherein the first polycrystalline silicon layer is implanted with N+ phosphorous at a concentration of approximately $1 \times 10^{18}/cm^3$.

11. The method of claim 2, wherein the first polycrystalline silicon layer is implanted with N+ arsenic.

12. The method of claim 2, wherein the first insulating layer is densified by dilution in $O_2$, $N_2$, or $H_2O$.

13. The method of claim 2, wherein the step of forming the second polycrystalline silicon layer comprises the steps of:

depositing amorphous silicon at a temperature of less than approximately 600 degrees Celsius; and annealing the amorphous silicon to form the second polycrystalline silicon layer.

14. The method of claim 2, wherein the second polycrystalline silicon layer has a large grain size characteristic of amorphous silicon having been deposited, recrystallized and annealed.

15. The method of claim 2, wherein the second insulating layer is silicon nitride.

16. The method of claim 2, wherein the second insulating layer is silicon dioxide.

17. The method of claim 2, wherein the first metal containing layer is a refractory metal.

18. The method of claim 17, wherein the first metal containing layer is titanium.

19. The method of claim 18, wherein, during the annealing step, the first metal containing layer is heated in a nitrogen atmosphere to produce titanium disilicide in the contact region and titanium nitride elsewhere, and the titanium nitride is subsequently stripped.

20. The method of claim 17, wherein the first metal containing layer is cobalt.

21. The method of claim 17, wherein the first metal containing layer is molybdenum.

22. The method of claim 2, wherein the annealing step creates a second metal containing layer over the first metal containing layer.

23. The method of claim 22, wherein the second metal containing layer is removed.

* * * * *